US011069722B2

(12) United States Patent
Matsukizono

(10) Patent No.: US 11,069,722 B2
(45) Date of Patent: Jul. 20, 2021

(54) ACTIVE MATRIX SUBSTRATE AND METHOD OF MANUFACTURING SAME

(71) Applicant: Sharp Kabushiki Kaisha, Sakai (JP)

(72) Inventor: Hiroshi Matsukizono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/617,573

(22) PCT Filed: May 21, 2018

(86) PCT No.: PCT/JP2018/019489
§ 371 (c)(1),
(2) Date: Nov. 27, 2019

(87) PCT Pub. No.: WO2018/221294
PCT Pub. Date: Dec. 6, 2018

(65) Prior Publication Data
US 2020/0185379 A1    Jun. 11, 2020

(30) Foreign Application Priority Data

May 31, 2017    (JP) .............................. JP2017-107836

(51) Int. Cl.
*H01L 27/12*    (2006.01)
*H01L 21/8234*    (2006.01)
(Continued)

(52) U.S. Cl.
CPC ...... *H01L 27/1251* (2013.01); *H01L 21/8234* (2013.01); *H01L 27/088* (2013.01);
(Continued)

(58) Field of Classification Search
CPC ............... H01L 27/088; H01L 21/8234; H01L 29/78645; H01L 29/7869; H01L 27/3262;
(Continued)

(56) References Cited

U.S. PATENT DOCUMENTS 5,304,829 A * 4/1994 Mori ..................... H01L 29/511
257/324
6,476,788 B1 * 11/2002 Akimoto ............. G02F 1/13454
345/92
(Continued)

FOREIGN PATENT DOCUMENTS

JP    2006-119404 A    5/2006
JP    2008-225036 A    9/2008
(Continued)

OTHER PUBLICATIONS

Official Communication issued in International Patent Application No. PCT/JP2018/019489, dated Jul. 24, 2018.

*Primary Examiner* — Feifei Yeung Lopez
(74) *Attorney, Agent, or Firm* — Keating & Bennett, LLP

(57) ABSTRACT

An active matrix substrate according to an embodiment of the present invention includes: a substrate; a plurality of first TFTs supported by the substrate and provided in a non-displaying region; and a peripheral circuit including the plurality of first TFTs. Each first TFT includes: a first gate electrode provided on the substrate; a first gate insulating layer covering the first gate electrode; a first oxide semi-conductor layer opposed to the first gate electrode via the first gate insulating layer; and a first source electrode and a first drain electrode connected to a source contact region and a drain contact region of the first oxide semiconductor layer. Each first TFT has a bottom contact structure. A first region of the first gate insulating layer that overlaps the channel region has a thickness which is smaller than a thickness of a second region of the first gate insulating layer that overlaps the source contact region and the drain contact region.

17 Claims, 9 Drawing Sheets

(51) Int. Cl.
  *H01L 27/088* (2006.01)
  *H01L 29/786* (2006.01)
  *H01L 27/32* (2006.01)

(52) U.S. Cl.
  CPC ...... *H01L 27/1259* (2013.01); *H01L 27/3262* (2013.01); *H01L 29/7869* (2013.01); *H01L 29/78645* (2013.01); *H01L 29/78648* (2013.01); *H01L 29/78696* (2013.01)

(58) Field of Classification Search
  CPC ............. H01L 27/1259; H01L 27/1251; H01L 29/78648
  See application file for complete search history.

(56) References Cited

U.S. PATENT DOCUMENTS

| | | | |
|---|---|---|---|
| 2008/0225024 A1 | 9/2008 | Ito | |
| 2009/0152506 A1* | 6/2009 | Umeda | H01L 21/02565 252/500 |
| 2010/0065838 A1 | 3/2010 | Yamazaki et al. | |
| 2010/0117076 A1* | 5/2010 | Akimoto | H01L 29/66969 257/43 |
| 2010/0224880 A1 | 9/2010 | Kimura | |
| 2010/0258802 A1 | 10/2010 | Godo et al. | |
| 2011/0012105 A1* | 1/2011 | Yamazaki | H01L 27/1233 257/43 |
| 2011/0012118 A1 | 1/2011 | Yamazaki et al. | |
| 2012/0138922 A1 | 6/2012 | Yamazaki et al. | |
| 2012/0280230 A1* | 11/2012 | Akimoto | H01L 27/1225 257/43 |
| 2013/0038518 A1 | 2/2013 | Tagawa et al. | |
| 2013/0300456 A1 | 11/2013 | Lennon | |
| 2013/0320334 A1 | 12/2013 | Yamazaki et al. | |
| 2014/0124776 A1 | 5/2014 | Takahashi et al. | |
| 2014/0286076 A1 | 9/2014 | Aoki et al. | |
| 2014/0332800 A1* | 11/2014 | Hanaoka | H01L 27/124 257/43 |
| 2015/0356940 A1* | 12/2015 | Yamaguchi | G02F 1/13454 345/92 |
| 2017/0317217 A1 | 11/2017 | Ito et al. | |

FOREIGN PATENT DOCUMENTS

| | | |
|---|---|---|
| JP | 2010-093238 A | 4/2010 |
| JP | 2010-232652 A | 10/2010 |
| JP | 2010-263195 A | 11/2010 |
| JP | 2012-134475 A | 7/2012 |
| JP | 2013-254951 A | 12/2013 |
| JP | 2014-007399 A | 1/2014 |
| JP | 2014-205902 A | 10/2014 |
| JP | 2014-209727 A | 11/2014 |
| JP | 2015-111703 A | 6/2015 |
| JP | 2016-157955 A | 9/2016 |
| WO | 2011/118079 A1 | 9/2011 |
| WO | 2016/076168 A1 | 5/2016 |

* cited by examiner

ACTIVE MATRIX SUBSTRATE AND METHOD OF MANUFACTURING SAME

TECHNICAL FIELD

The present invention relates to an active matrix substrate and a production method thereof, and more particularly to an active matrix substrate that includes oxide semiconductor TFTs and a production method thereof.

BACKGROUND ART

An active matrix substrate which is used for liquid crystal display devices or the like has a displaying region including a plurality of pixels and a region other than the displaying region (a non-displaying region or a frame region). In the displaying region, a thin film transistor (Thin Film Transistor; hereinafter "TFT") is provided for each pixel. As TFTs, TFTs whose active layer is an amorphous silicon film (hereinafter "amorphous silicon TFTs") and TFTs whose active layer is a polycrystalline silicon film (hereinafter "polycrystalline silicon TFTs") are widely used.

Recently it has been proposed to use an oxide semiconductor as the material of the active layers of TFTs, instead of an amorphous silicon or a polycrystalline silicon. Such TFTs are called "oxide semiconductor TFTs". An oxide semiconductor has a higher mobility than does an amorphous silicon. Therefore, oxide semiconductor TFTs can operate more rapidly than amorphous silicon TFTs.

There are cases where peripheral circuits such as driving circuits are monolithically (integrally) formed in a non-displaying region of an active matrix substrate. By monolithically forming driving circuits, narrowing-down of the non-displaying region (frame narrowing) or cost reduction that results from simplification of the mounting steps can be achieved. For example, in the non-displaying region, gate driver circuits may be monolithically formed, and source driver circuits may be mounted in COG (Chip on Glass) fashion.

In smartphones or other devices for which a narrow frame construction is highly expected, it has been proposed to monolithically form a demultiplexer circuit, e.g., a Source Shared Driving (SSD) circuit (for example, Patent Document 1), in addition to gate drivers. An SSD circuit is a circuit which allows video data from a single video signal line from a respective terminal of a source driver to be split (distributed) among a plurality of source bus lines. Due to incorporation of an SSD circuit, the region within the non-displaying region where terminal portions and wiring lines are disposed (terminal portion/wiring formation region) can be further narrowed. Moreover, the number of outputs from the source driver decreases, and the circuit scale can be reduced, whereby costs for the driver IC can be reduced.

Peripheral circuitry such as driving circuits and SSD circuits include TFTs. In the present specification, a TFT that is disposed as a switching element for each pixel of the displaying region will be referred to as a "pixel TFT", and a TFT that composes a peripheral circuit will be referred to as a "circuit TFT". Among circuit TFTs, those TFTs which compose a driving circuit will be referred to as "driving-circuit TFTs", and those TFTs which are used as switching elements in a demultiplexer circuit (SSD circuit) will be referred to as "DMX-circuit TFTs".

As has already been described, the mobility of an oxide semiconductor is higher than that of an amorphous silicon, but is currently lower than that of a polycrystalline silicon. For example, the mobility of an In—Ga—Zn—O based oxide semiconductor (In:Ga:Zn=1:1:1) is lower by approximately one digit than that of a polycrystalline silicon. Therefore, an oxide semiconductor TFT has a lower driving ability (i.e., a smaller ON current) than that of a polycrystalline silicon TFT. Therefore, when oxide semiconductor TFTs are used for an active matrix substrate, the driving ability may be less sufficient than in the case of using polycrystalline silicon TFTs. For example, a DMX-circuit TFT is required to have a high driving ability. A demultiplexer circuit needs to be driven by a frequency which results by multiplying the driving frequency of the display device with the number of distributed outputs, and a DMX-circuit TFT is required to have an ability to charge a source bus line in a short period of time.

In order to improve the driving ability (i.e., increase the ON current), it may be possible to adopt a "double gate structure" for an oxide semiconductor TFT. In the present specification, a structure in which gate electrodes are respectively disposed on the substrate side of the oxide semiconductor layer and on the opposite side from the substrate are referred to as a "double gate structure". Moreover, the gate electrode which is disposed on the substrate side of the oxide semiconductor layer will be referred to as the "lower gate electrode", and the gate electrode disposed above the oxide semiconductor layer as the "upper gate electrode".

An active matrix substrate that includes oxide semiconductor TFTs of double-gate structure is disclosed in Patent Document 2, for example.

CITATION LIST

Patent Literature

[Patent Document 1] International Publication No. 2011/118079

[Patent Document 2] International Publication No. 2016/076168

SUMMARY OF INVENTION

Technical Problem

Although an oxide semiconductor TFT of double gate structure may have improved TFT characteristics (i.e., increased ON current), it may have a large parasitic capacitance due to its structure. The large parasitic capacitance is caused by parasitic capacitors (electrostatic capacitors) being created between the lower gate electrode and the source/drain electrode, and between the upper gate electrode and the source/drain electrode.

Thus, when a double gate structure is adopted, the ON current may increase due to gate electrodes being disposed both above and below the oxide semiconductor layer, but the capacitance to be charged also increases, thus making it difficult for the overall circuit to have an adequately improved charging ability.

The present invention has been made in view of the above problem, and an objective thereof is to improve the driving ability of an oxide semiconductor TFT while suppressing an increase in its parasitic capacitance.

Solution to Problem

An active matrix substrate according to an embodiment of the present invention is an active matrix substrate having a displaying region including a plurality of pixels and a non-displaying region located around the displaying region, the active matrix substrate comprising: a substrate; a plurality of first TFTs supported by the substrate and provided in the non-displaying region; and a peripheral circuit including the plurality of first TFTs, each of the plurality of first TFTs including: a first gate electrode provided on the substrate; a first gate insulating layer covering the first gate electrode; a first oxide semiconductor layer opposed to the first gate electrode via the first gate insulating layer, the first oxide semiconductor layer including a channel region and a source contact region and a drain contact region located on opposite sides of the channel region; a first source electrode connected to the source contact region of the first oxide semiconductor layer; and a first drain electrode connected to the drain contact region of the first oxide semiconductor layer, wherein, each of the plurality of first TFTs has a bottom contact structure such that the first source electrode and the first drain electrode are in contact with a lower face of the first oxide semiconductor layer; and a first region of the first gate insulating layer that overlaps the channel region has a thickness which is smaller than a thickness of a second region of the first gate insulating layer that overlaps the source contact region and the drain contact region.

In one embodiment, the peripheral circuit is a demultiplexer circuit.

In one embodiment, the active matrix substrate further comprises a plurality of second TFTs supported by the substrate and provided in the displaying region and/or the non-displaying region, each of the plurality of second TFTs including: a second gate electrode provided on the substrate; a second gate insulating layer covering the second gate electrode; a second oxide semiconductor layer opposed to the second gate electrode via the second gate insulating layer, the second oxide semiconductor layer including a channel region and a source contact region and a drain contact region located on opposite sides of the channel region; a second source electrode connected to the source contact region of the second oxide semiconductor layer; and a second drain electrode connected to the drain contact region of the second oxide semiconductor layer, wherein each of the plurality of second TFTs has a top contact structure such that the second source electrode and the second drain electrode are in contact with an upper face of the second oxide semiconductor layer.

In one embodiment, a thickness of the first region of the first gate insulating layer is set so that a gate capacitance of each of the plurality of first TFTs is equal to or greater than twice a gate capacitance of each of the plurality of second TFTs.

In one embodiment, the active matrix substrate further comprises a third oxide semiconductor layer covering the channel region of the second oxide semiconductor layer, the third oxide semiconductor layer being made of a same oxide semiconductor film as the first oxide semiconductor layer.

In one embodiment, the plurality of second TFTs include a pixel TFT disposed for each of the plurality of pixels.

In one embodiment, the active matrix substrate further comprises a driving circuit provided in the non-displaying region, wherein the plurality of second TFTs include a TFT composing the driving circuit.

In one embodiment, the second oxide semiconductor layer has a multilayer structure.

In one embodiment, the first oxide semiconductor layer comprises an In—Ga—Zn—O based semiconductor.

In one embodiment, the In—Ga—Zn—O based semiconductor includes a crystalline portion.

A method of producing an active matrix substrate according to an embodiment of the present invention is a method of producing an active matrix substrate having a displaying region including a plurality of pixels and a non-displaying region located around the displaying region, the active matrix substrate comprising: a substrate; a plurality of first TFTs supported by the substrate and provided in the non-displaying region; and a peripheral circuit including the plurality of first TFTs, each of the plurality of first TFTs including: a first gate electrode provided on the substrate; a first gate insulating layer covering the first gate electrode; a first oxide semiconductor layer opposed to the first gate electrode via the first gate insulating layer, the first oxide semiconductor layer including a channel region and a source contact region and a drain contact region located on opposite sides of the channel region; a first source electrode connected to the source contact region of the first oxide semiconductor layer; and a first drain electrode connected to the drain contact region of the first oxide semiconductor layer, the method comprising: (A) a step of forming the first gate electrode on the substrate; (B) a step of forming the first gate insulating layer covering the first gate electrode; (C) a step of forming the first source electrode and the first drain electrode on the first gate insulating layer; (D) a step of forming the first oxide semiconductor layer after step (C), wherein the first oxide semiconductor layer is formed so that the first source electrode and the first drain electrode are in contact with a lower face of the first oxide semiconductor layer; and (E) a step, between step (C) and step (D), of causing a first region of the first gate insulating layer that is exposed between the first source electrode and the first drain electrode to become thinner than a second region of the first gate insulating layer that overlaps the first source electrode and the first drain electrode.

In one embodiment, the peripheral circuit is a demultiplexer circuit.

In one embodiment, in step (E), the first region of the first gate insulating layer is made thin so that a gate capacitance of each of the plurality of first TFTs is equal to or greater than twice that of a case where step (E) is not performed.

In one embodiment, step (B) comprises: (B1) a step of forming a silicon nitride layer covering the first gate electrode; and (B2) a step of forming a silicon oxide layer on the silicon nitride layer; and, in step (E), at least a portion of the silicon oxide layer that is located in the first region is removed.

In one embodiment, the method of producing an active matrix substrate further comprises a step (F), between step (E) and step (D), of oxidizing a surface of a portion of the silicon nitride layer that is located in the first region.

In one embodiment, the active matrix substrate further comprises a plurality of second TFTs supported by the substrate and provided in the displaying region and/or the non-displaying region, each of the plurality of second TFTs including: a second gate electrode provided on the substrate; a second gate insulating layer covering the second gate electrode; a second oxide semiconductor layer opposed to the second gate electrode via the second gate insulating layer, the second oxide semiconductor layer including a channel region and a source contact region and a drain contact region located on opposite sides of the channel region; a second source electrode connected to the source contact region of the second oxide semiconductor layer; and a second drain electrode connected to the drain contact region of the second oxide semiconductor layer, and the method of producing an active matrix substrate further comprises a step (G), between (B) and step (C), of forming the second oxide semiconductor layer on the second gate insulating layer, wherein, in step (C), when the first source electrode and the first drain electrode are formed, the second source electrode and the second drain electrode are formed so as to be in contact with an upper face of the second oxide semiconductor layer.

In one embodiment, in step (D), when the first oxide semiconductor layer is formed, a third oxide semiconductor layer covering the channel region of the second oxide semiconductor layer is formed.

In one embodiment, the plurality of second TFTs include a pixel TFT disposed for each of the plurality of pixels.

In one embodiment, the active matrix substrate further comprises a driving circuit provided in the non-displaying region; and the plurality of second TFTs include a TFT composing the driving circuit.

In one embodiment, the second oxide semiconductor layer has a multilayer structure.

In one embodiment, the first oxide semiconductor layer comprises an In—Ga—Zn—O based semiconductor.

In one embodiment, the In—Ga—Zn—O based semiconductor includes a crystalline portion.

Advantageous Effects of Invention

According to an embodiment of the present invention, it is possible to improve the driving ability of an oxide semiconductor TFT while suppressing an increase in its parasitic capacitance.

DESCRIPTION OF EMBODIMENTS

Hereinafter, an embodiment of the present invention will be described with reference to the drawings. Note that the present invention is not limited to the following embodiment.

An active matrix substrate according to the present embodiment has at least one peripheral circuit monolithically formed thereon. The peripheral circuit may be a demultiplexer circuit such as an SSD circuit, for example. Hereinafter, an active matrix substrate on which an SSD circuit and gate drivers are monolithically formed, with a source driver being mounted thereon, will be described as an example.

[Schematic Construction of Active Matrix Substrate]

Figure 1:
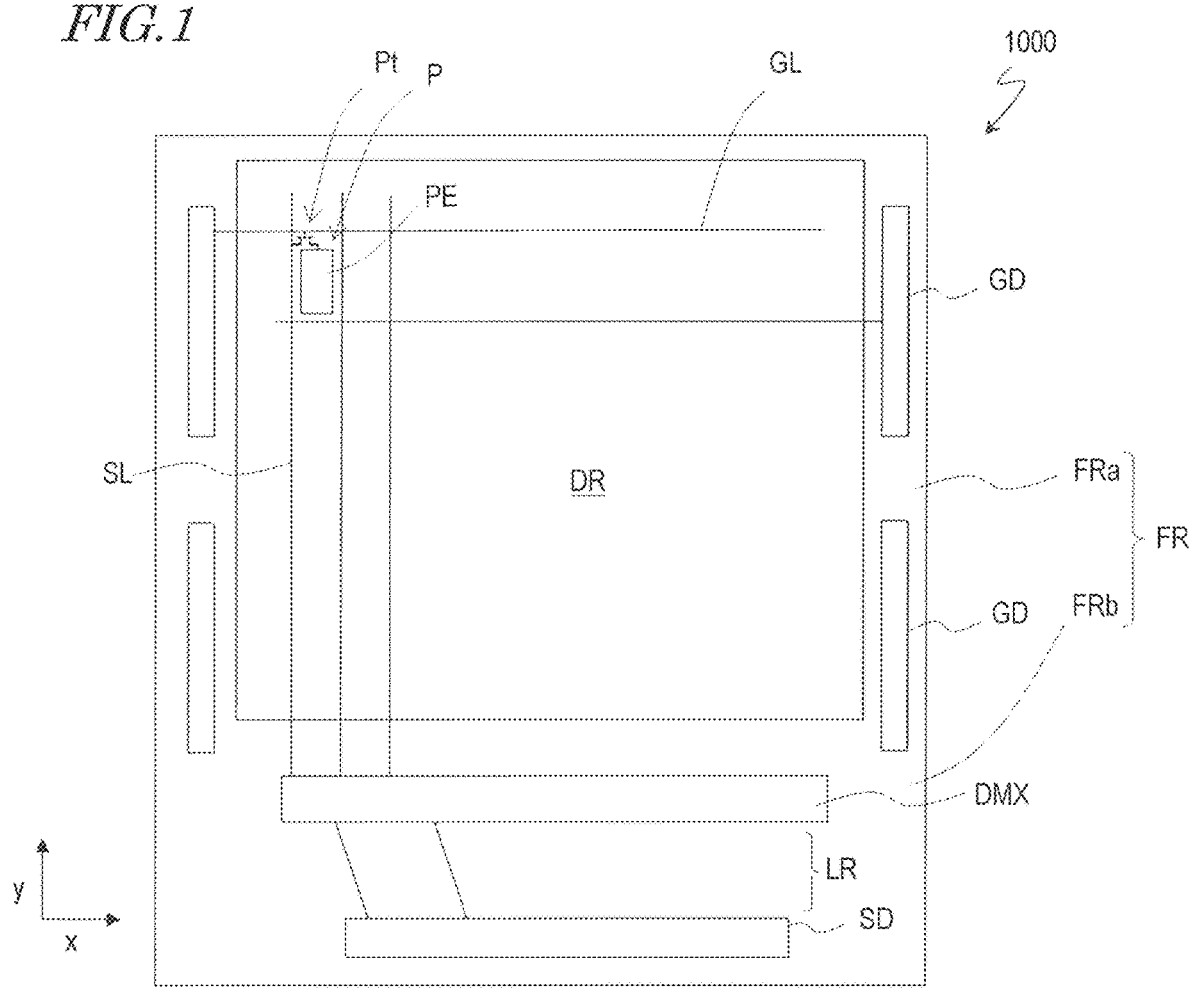
FIG. 1 A schematic illustration showing an exemplary planar structure of an active matrix substrate 1000 according to an embodiment of the present invention.

FIG. 1 is a schematic illustration showing an exemplary planar structure of an active matrix substrate 1000 according to the present embodiment.

The active matrix substrate 1000 has a displaying region DR and a region other than the displaying region DR (non-displaying region) FR. The displaying region DR includes a plurality of pixel regions P which are arranged in a matrix shape. The pixel regions P are regions corresponding to pixels of the display device. Hereinafter, pixel regions P may simply be referred to "pixels". The non-displaying region (also referred to as the "frame region") FR is a region which is located around the displaying region DR and does not contribute to displaying.

In the non-displaying region FR, for example, gate drivers GD, a demultiplexer circuit DMX functioning as an SSD circuit, and the like are integrally (monolithically) formed. The source driver SD is mounted on the active matrix substrate 1000. In the illustrated example, the gate drivers GD are disposed in regions FRa which are located on both lateral sides of the displaying region DR, and the source driver SD is mounted in a region FRb which is located below the displaying region DR. In the region FRb, the demultiplexer circuit DMX is disposed between the displaying region DR and the source driver SD. Between the demultiplexer circuit DMX and the source driver SD is a terminal portion/wiring formation region LR in which a plurality of terminal portions and wiring lines are formed.

In the displaying region DR, a plurality of gate bus lines GL extending along the row direction (x direction) and a plurality of source bus lines SL extending along the column direction (y direction) are formed. Each pixel P is defined by gate bus lines GL and source bus lines SL, for example. The gate bus lines GL are connected to the respective terminals of the gate drivers GD. The source bus lines SL are connected to the respective terminals of the source driver SD.

Each pixel P includes a thin film transistor Pt and a pixel electrode PE. The thin film transistors Pt are also referred to as "pixel TFTs". The gate electrode of a thin film transistor Pt is electrically connected to a corresponding gate bus line GL, and the source electrode is electrically connected to a corresponding source bus line SL. Moreover, the drain electrode of a thin film transistor Pt is electrically connected to a pixel electrode PE. In the case where the active matrix substrate 1000 is applied to a liquid crystal display device of a lateral field mode, such as an FFS (Fringe Field Switching) mode, an electrode (common electrode) is provided in common for the plurality of pixels on the active matrix substrate 1000, although not shown.

[Construction of Demultiplexer Circuit]

Figure 2:
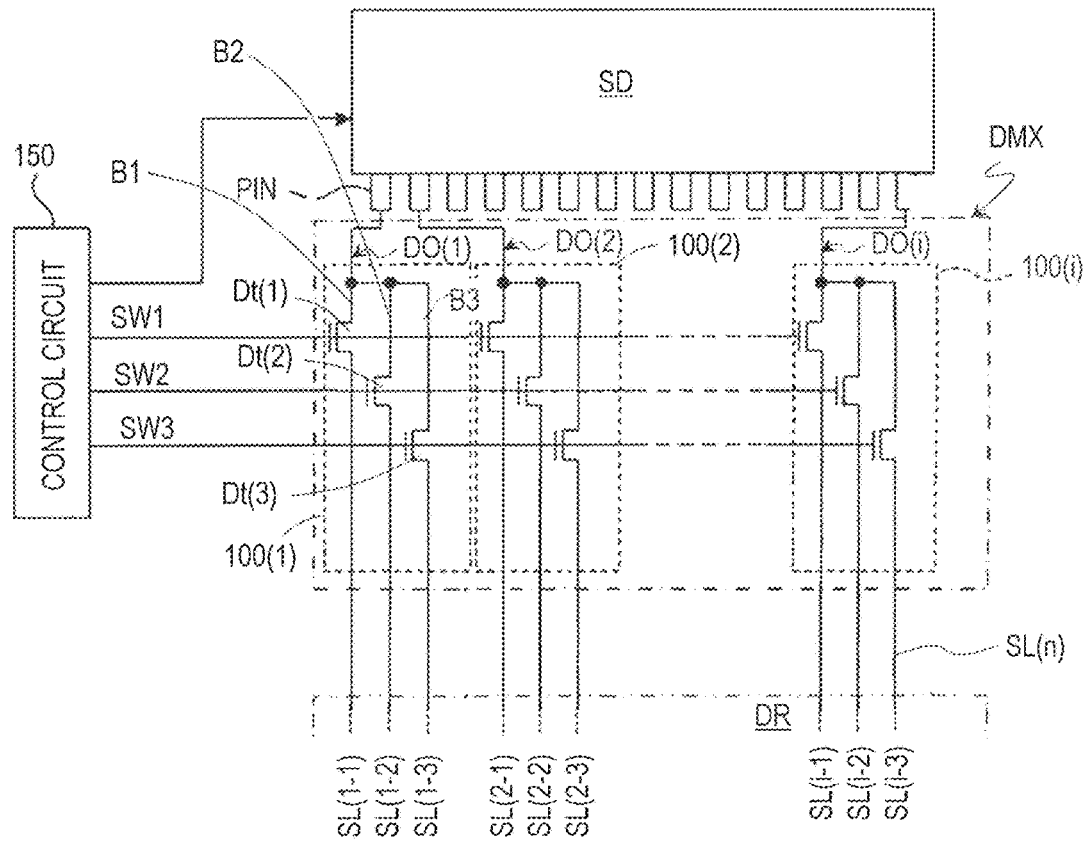
FIG. 2 A diagram for describing the construction and operation of a demultiplexer circuit DMX which is included in the active matrix substrate.

FIG. 2 is a diagram for describing the construction and operation of a demultiplexer circuit DMX which is included in the active matrix substrate 1000.

The demultiplexer circuit DMX is disposed between the source driver SD and the displaying region DR. The demultiplexer circuit DMX includes a plurality of unit circuits 100(1) to 100(i) (where i is an integer of two or greater) (which hereinafter may be collectively referred to as "unit circuits 100"). The demultiplexer circuit DMX and the source driver SD are controlled by a control circuit 150 which is provided in the non-displaying region FR.

To each output pin (output terminal) PIN of the source driver SD, one of a plurality of video signal lines DO(1) to DO(i) (which may be collectively referred to as "video signal lines DO") is connected. To one video signal line DO, n (where n is an integer of two or greater; herein n=3) source bus lines SL, which are so-grouped, are associated. Between the video signal line DO and the grouped source bus lines SL, a unit circuit 100 is provided from video signal line to video signal line. The unit circuit 100 distributes video data from the one video signal line DO to the n source bus lines SL.

In the present specification, among the plurality of video signal lines DO(1) to DO(i), an $N^{th}$ video signal line would be referred to as DO(N) (where N is an integer from 1 to i), and a unit circuit 100 and source bus lines SL that are associated with the video signal line DO(N) would be respectively referred to as 100(N) and SL(N-1) to SLIM-n). The source bus lines SL(N-1) to SL(N-n) may be associated with R, G and B pixels (i.e., n=3), for example.

Each unit circuit 100(N) includes n branch lines B1 to Bn (which hereinafter may be collectively referred to as "branch lines B") connected to the video signal line DO(N), n control signal lines SW1 to SWn (which hereinafter may be collectively referred to as "control signal lines SW"), and n DMX-circuit TFTs Dt(1) to Dt(n) (which hereinafter may be collectively referred to as "DMX-circuit TFTs Dt"). The control signal lines SW1 to SWn are connected to the control circuit 150.

A DMX-circuit TFT Dt functions as a selection switch. The gate electrode of a DMX-circuit TFT Dt is electrically connected to a corresponding one of the control signal lines SW1 to SWn. The source electrode of a DMX-circuit TFT Dt is electrically connected to a corresponding one of the branch lines B1 to Bn. The drain electrode of a DMX-circuit TFT Dt is connected to a corresponding one of the source bus lines SL(N-1) to SL(N-3).

To the gate electrode of the DMX-circuit TFTs Dt, selection signals are supplied from the control signal lines SW1 to SW3. The selection signals define ON periods of the selection switches within the same group, and are synchronized with chronologically-ordered signal outputs from the source driver SD. The unit circuit 100(N) writes, in chronological order, data potentials which are obtained through time division of the output on the video signal line DO(N) to the plurality of source bus lines SL(N-1) to SL(N-n) (time-division driving). This allows the number of output pins PIN of the source driver SD to be reduced, whereby the geometric area of the non-displaying region FR can be further reduced (a narrow frame construction).

Note that the operation of a display device in which a demultiplexer circuit DMX is used, timing charts for time-division driving, and the like are disclosed in Japanese Laid-Open Patent Publication No. 2008-225036, Japanese Laid-Open Patent Publication No. 2006-119404, International Publication No. 2011/118079 (Patent Document 1), and so on, for example. In the present specification, the entire disclosure of Japanese Laid-Open Patent Publication No. 2008-225036, Japanese Laid-Open Patent Publication No. 2006-119404, and International Publication No. 2011/118079 is incorporated herein by reference.

[Construction of First TFTs Included in Peripheral Circuit]

Figure 3:
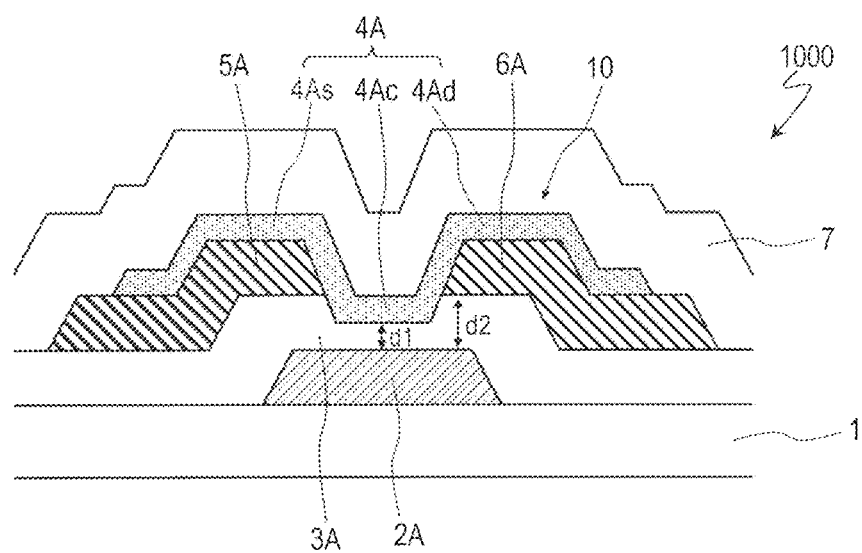
FIG. 3 A cross-sectional view schematically showing a first TFT 10 which is included in the active matrix substrate 1000.

The active matrix substrate 1000 includes a plurality of first TFTs which are included in the peripheral circuit (i.e., provided in the non-displaying region FR). Hereinafter, with reference to FIG. 3, the structure of a first TFT will be described. FIG. 3 is a cross-sectional view schematically showing a first TFT 10 which is included in the active matrix substrate 1000.

As shown in FIG. 3, the first TFT 10 is supported by the substrate 1. The first TFT 10 includes a gate electrode 2A, a gate insulating layer 3A, an oxide semiconductor layer 4A, a source electrode 5A, and a drain electrode 6A.

The gate electrode 2A is provided on the substrate 1. The gate insulating layer 3A covers the gate electrode 2A.

The oxide semiconductor layer 4A is opposed to the gate electrode 2A via the gate insulating layer 3A. The oxide semiconductor layer 4A includes a channel region 4Ac as well as a source contact region 4As and a drain contact region 4Ad which are located on opposite sides of the channel region 4Ac.

The source electrode 5A is connected to the source contact region 4As of the oxide semiconductor layer 4A. The drain electrode 6A is connected to the drain contact region 4Ad of the oxide semiconductor layer 4A.

The source electrode 5A and drain electrode 6A of the first TFT 10 are in contact with a lower face of the oxide semiconductor layer 4A. In other words, the first TFT 10 has a bottom contact structure.

The first TFT 10 is covered by an inorganic insulating layer (passivation layer) 7.

In the active matrix substrate 1000 according to the present embodiment, a region (which hereinafter may also be referred to as the "first region") of the gate insulating layer 3A of the first TFT 10 that overlaps the channel region 4Ac has a thickness d1 which is smaller than a thickness d2 of a region (which hereinafter may also be referred to as the "second region") of the gate insulating layer 3A that overlaps the source contact region 4As and the drain contact region 4Ad. In other words, the first region (i.e., the region corresponding to the channel region 4Ac) of the gate insulating layer 3A is selectively thinned. As a result, without inducing an increase in the parasitic capacitance between the gate electrode 2A and the source electrode 5A and drain electrode 6A, the driving ability of the first TFT 10 can be improved. Moreover, since the first TFT 10 does not have a double gate structure (i.e., it does not include an additional gate electrode that is located above the oxide semiconductor layer 4A), no increase in parasitic capacitance that is associated with a double gate structure (as would be caused by a parasitic capacitor being created between the additional gate electrode and the source electrode and drain electrode) occurs, either.

From the standpoint of providing an improved driving ability, it may be preferable that the difference between the thickness d1 of the first region and the thickness d2 of the second region of the gate insulating layer 3A is as large as possible. Specifically, the thickness d1 of the first region of the gate insulating layer 3A is preferably set so that the gate capacitance of the first TFT 10 is equal to or greater than twice that of the case where the first region of the gate insulating layer 3A is not thinned (i.e., an imaginary case where the thickness d1 of the first region is equal to the thickness d2 of the second region).

The first TFT 10 having the aforementioned construction may have a high driving ability, and is suitably used as a DMX-circuit TFT Dt, for example. The first TFT 10 may also be used for any peripheral circuit other than a demultiplexer circuit.

[Construction of Second TFTs]

The active matrix substrate 1000 may include a plurality of second TFTs which are provided in the displaying region DR and/or the non-displaying region FR, each having a different structure from that of the first TFTs 10. The plurality of second TFTs may include pixel TFTs which are respectively provided in the plurality of pixels P. Moreover, the plurality of second TFTs may include TFTs which compose driving circuits (e.g., the gate drivers GD).

Figure 4:
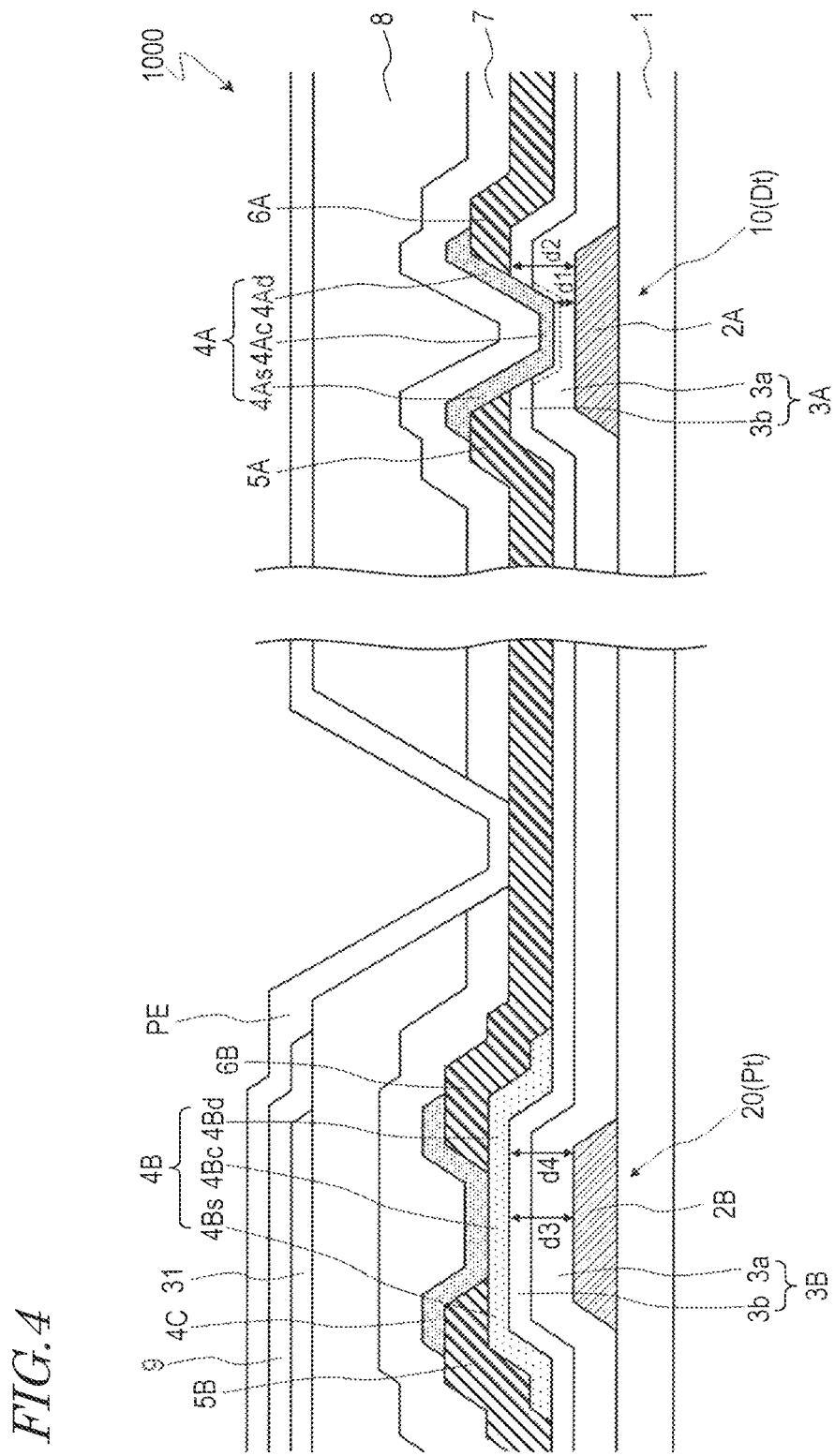
FIG. 4 A cross-sectional view schematically showing a second TFT 20 which is included in the active matrix substrate 1000, together with a first TFT 10.

Hereinafter, with reference to FIG. 4, the construction of a second TFT will be described. FIG. 4 is a cross-sectional view schematically showing a second TFT 20 which is included in the active matrix substrate 1000, together with a first TFT 10. The description here is based on an exemplary case where the first TFT 10 is a DMX-circuit TFT Dt and the second TFT 20 is a pixel TFT Pt. Moreover, the exemplary construction illustrated in FIG. 4 is a construction for a liquid crystal display device of the FFS mode.

The first TFT 10 (DMX-circuit TFT Dt) shown in FIG. 4 is substantially identical in structure to the first TFT 10 shown in FIG. 3. However, in the example shown in FIG. 4, the gate insulating layer 3A has a multilayer structure including a silicon nitride layer 3a and a silicon oxide layer 3b which is provided on the silicon nitride layer 3a.

As shown in FIG. 4, the second TFT 20 (pixel TFT Pt) is supported by the substrate 1. The second TFT 20 includes a gate electrode 2B, a gate insulating layer 3B, an oxide semiconductor layer 4B, a source electrode 5B, and a drain electrode 6B.

The gate electrode 2B is provided on the substrate 1. The gate insulating layer 3B covers the gate electrode 2B.

The oxide semiconductor layer 4B is opposed to the gate electrode 2B via the gate insulating layer 3B. The oxide semiconductor layer 4B includes a channel region 4Bc as well as a source contact region 4Bs and a drain contact region 4Bd which are located on opposite sides of the channel region 4Bc.

The source electrode 5B is connected to the source contact region 4Bs of the oxide semiconductor layer 4B. The drain electrode 6B is connected to the drain contact region 4Bd of the oxide semiconductor layer 4B.

The source electrode 5B and drain electrode 6B of the second TFT 20 are in contact with an upper face of the oxide semiconductor layer 4B. In other words, the second TFT 20 has a top contact structure.

Similarly to the first TFT 10, the second TFT 20 is covered by the inorganic insulating layer (passivation layer) 7. On the inorganic insulating layer 7, an organic insulating layer (planarization layer) 8 is provided.

A common electrode 31 is provided on the organic insulating layer 8. A dielectric layer 9 is provided so as to cover the common electrode 31. On the dielectric layer 9, a pixel electrode PE is provided.

A region of the gate insulating layer 3B of the second TFT 20 that overlaps the channel region 4Bc has a thickness d3 which is equal to a thickness d4 of a region of the gate insulating layer 3B that overlaps the source contact region 4Bs and drain contact region 4Bd. In other words, the region of the gate insulating layer 3B that corresponds to the channel region 4Bc is not thinned.

The active matrix substrate 1000 further includes an oxide semiconductor layer 4C covering the channel region 4Bc of the oxide semiconductor layer 4B of the second TFT 20. The oxide semiconductor layer 4C is made of the same oxide semiconductor film (i.e., in the same step) as the oxide semiconductor layer 4A of the first TFT 10.

Figure 5:
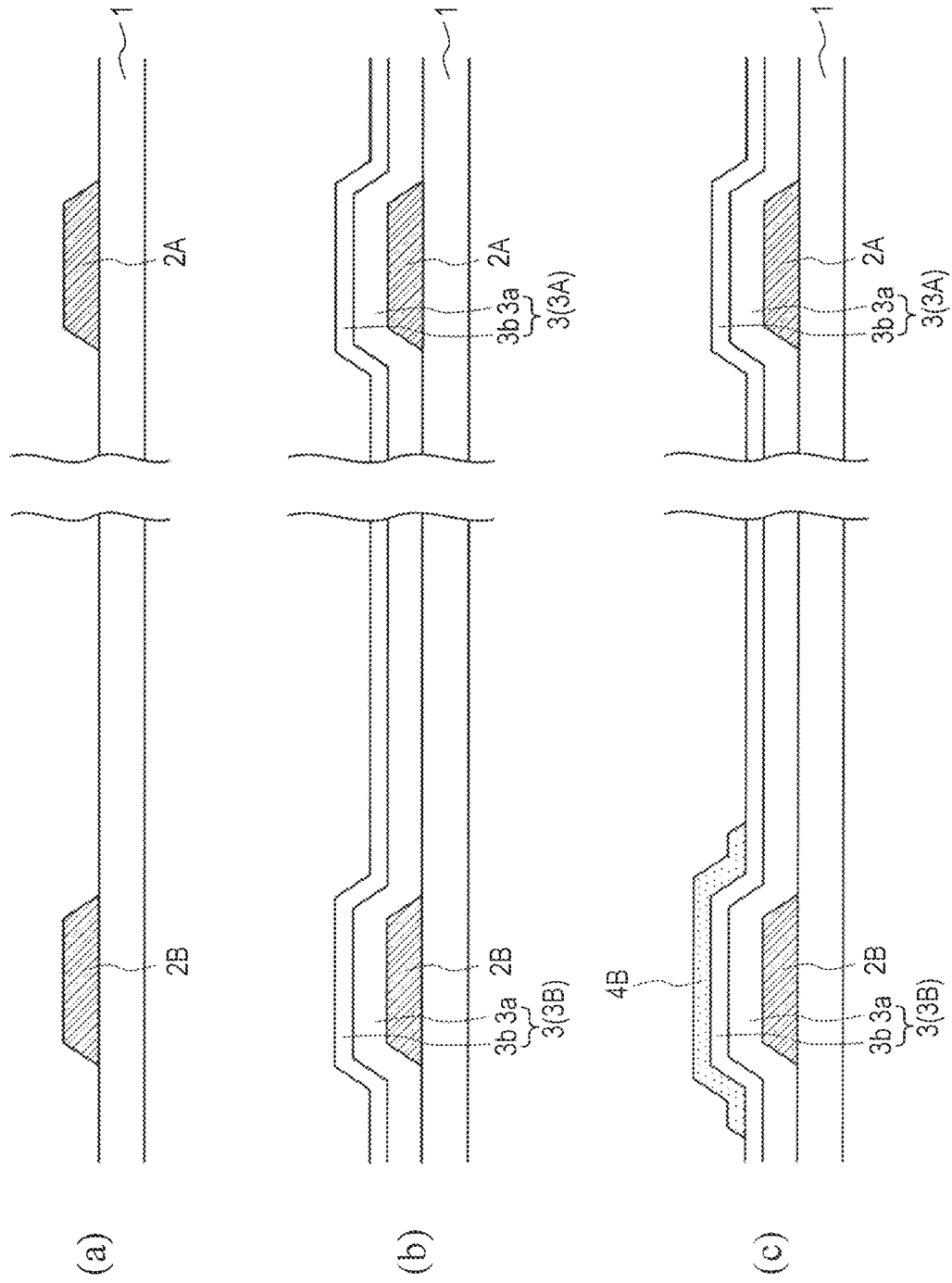
FIG. 5 (a), (b) and (c) are step-by-step cross-sectional views showing production steps of the active matrix substrate.

Now, with reference to FIG. 5 to FIG. 10, a method of producing an active matrix substrates 1000 that includes a first TFT 10 and a second TFT 20 will be described. FIGS. 5(*a*) through (*c*), FIGS. 6(*a*) and (*b*), FIGS. 7(*a*) and (*b*), FIGS. 8(*a*) and (*b*), FIGS. 9(*a*) and (*b*), and FIGS. 10(*a*) and (*b*) are step-by-step cross-sectional views showing production steps for the active matrix substrate 1000.

First, as shown in FIG. 5(*a*), gate electrodes 2A and 2B are formed on a substrate 1. For example, after depositing an electrically conductive film by sputtering, the electrically conductive film may be patterned through a photolithography process, thereby forming the gate electrodes 2A and 2B.

As the substrate 1, a glass substrate, a silicon substrate, a plastic substrate (resin substrate) which is thermally resistant, or the like may be used, for example. As the electrically conductive film (gate metal film) from which to form the gate electrodes 2A and 2B, a film containing a metal such as aluminum (Al), tungsten (W), molybdenum (Mo), tantalum (Ta), chromium (Cr), titanium (Ti), copper (Cu), or gold (Au), or an alloy thereof, or a nitride thereof may be used as appropriate. Moreover, a multilayer film in which a plurality of such films are stacked may also be used. Herein, as the gate metal film, a film in which a Ti film and a Cu film are stacked in this order is used. The gate electrodes 2A and 2B may have a thickness which is e.g. not less than 100 nm and not more than 500 nm.

Next, as shown in FIG. 5(*b*), gate insulating layers 3A and 3B (which hereinafter may also be collectively referred to as the "gate insulating layer 3") covering the gate electrodes 2A and 2B are formed. The gate insulating layer 3 may be formed by CVD technique, for example. As the gate insulating layer 3, a silicon oxide ($SiO_2$) layer, a silicon nitride (SiNx) layer, a silicon oxynitride (SiOxNy;x>y) layer, a silicon nitroxide (SiNxOy;x>y) layer, or the like may be used as appropriate. The gate insulating layer 3 may have a multilayer structure. Herein, a silicon nitride layer 3a is formed as a lower layer and a silicon oxide layer 3b is formed as an upper layer. In other words, the step of forming the gate insulating layers 3 includes a step of forming a silicon nitride layer 3a that covers the gate electrodes 2A and 2B and a step of forming a silicon oxide layer 3b on the silicon nitride layer 3a. The silicon nitride layer 3a may have a thickness of e.g. 325 nm, and the silicon oxide layer 3b may have a thickness of e.g. 50 nm.

Then, as shown in FIG. 5(*c*), an oxide semiconductor layer 4B is formed on the gate insulating layer 3 (3B). For example, after depositing an oxide semiconductor film by sputtering, the oxide semiconductor film may be patterned through a photolithography process, thereby forming an island-shaped oxide semiconductor layer 4B. The oxide semiconductor layer 4B is formed so as to overlap the gate electrode 2B via the gate insulating layer 3B. The oxide semiconductor layer 4B may have a thickness of e.g. not less than 10 nm and not more than 120 nm. As will be described later, the oxide semiconductor layer 4B may have a multilayer structure.

Figure 6:
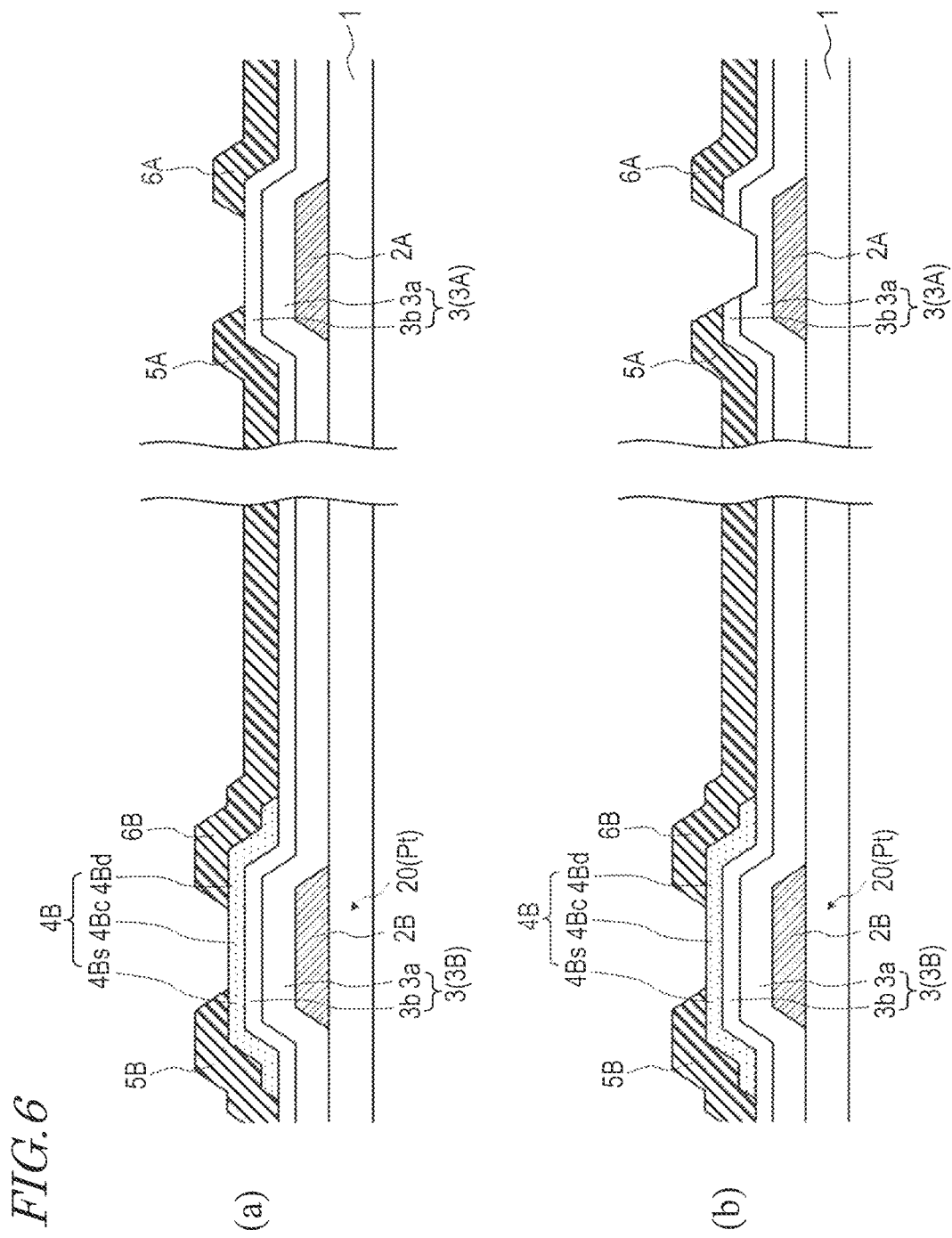
FIG. 6 (a) and (b) are step-by-step cross-sectional views showing production steps of the active matrix substrate.
Figure 7:
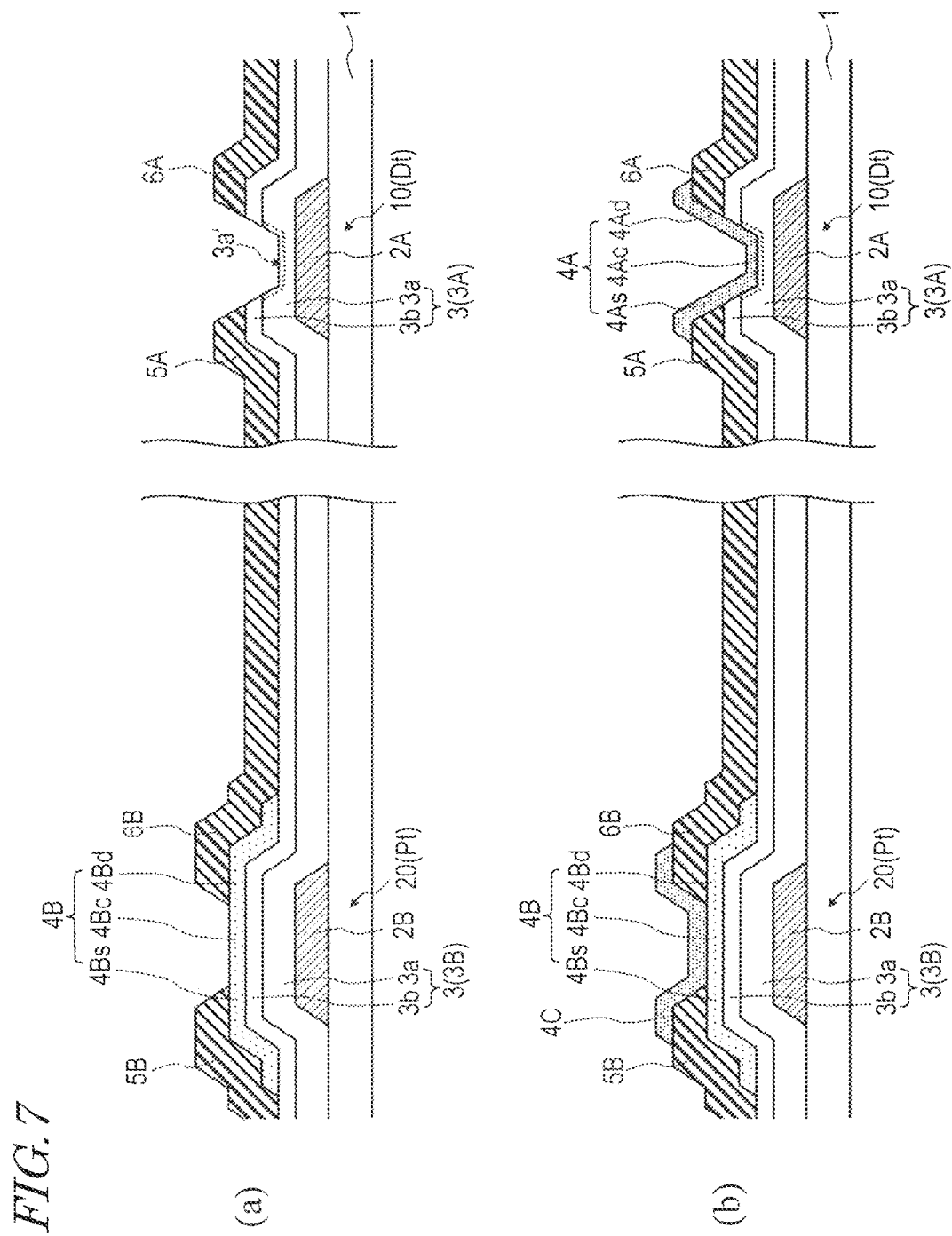
FIG. 7 (a) and (b) are step-by-step cross-sectional views showing production steps of the active matrix substrate.
Figure 8:
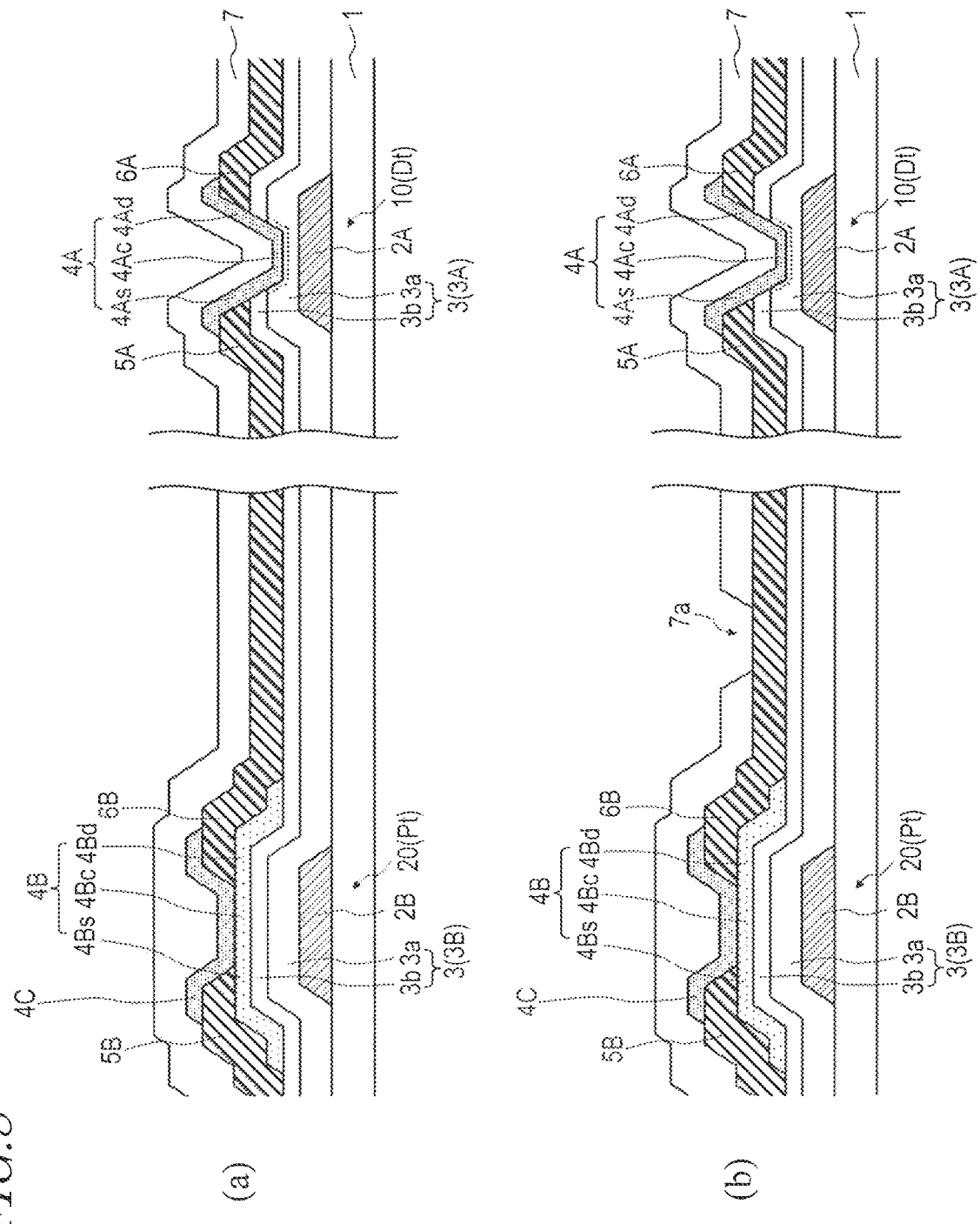
FIG. 8 (a) and (b) are step-by-step cross-sectional views showing production steps of the active matrix substrate.
Figure 9:
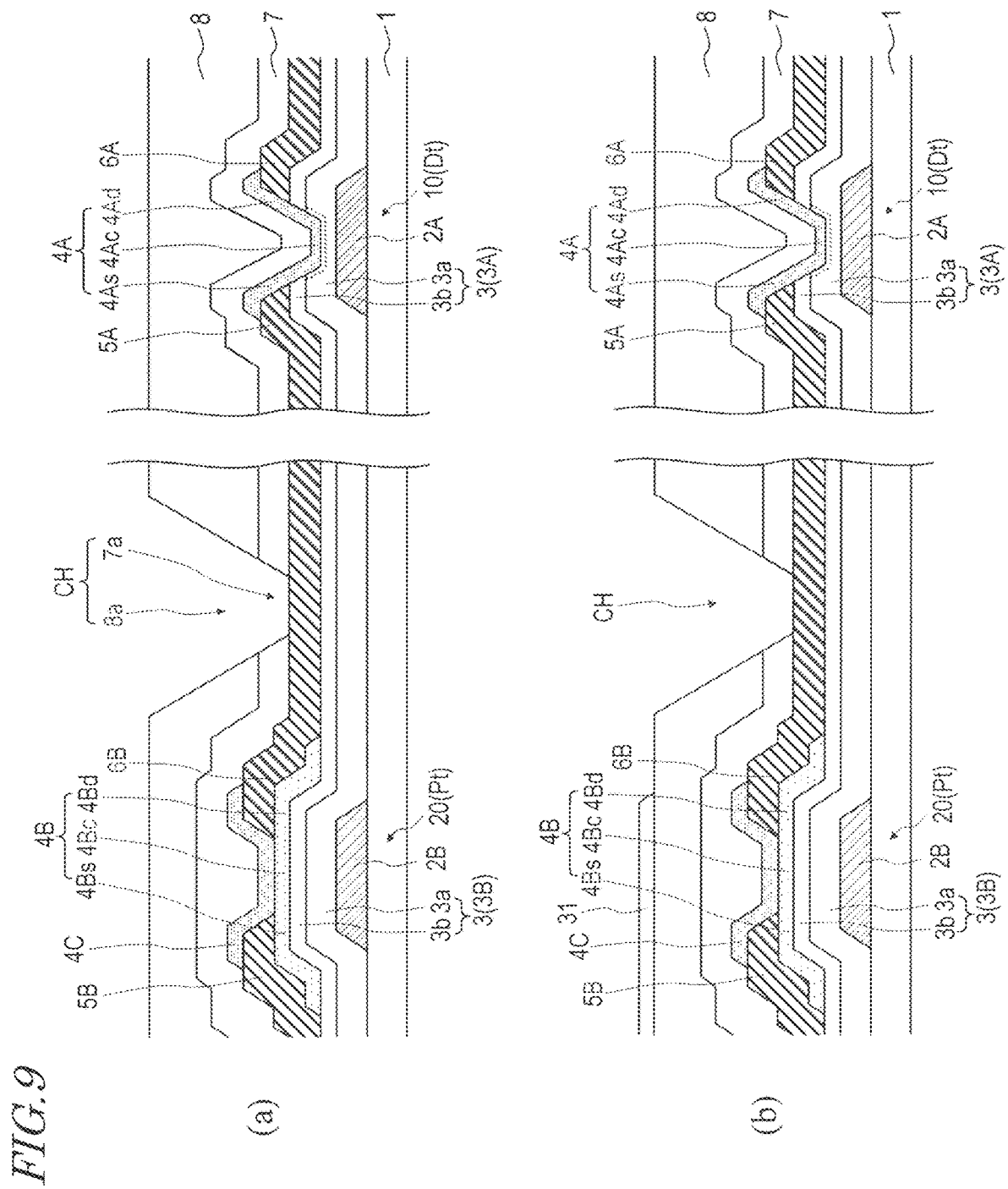
FIG. 9 (a) and (b) are step-by-step cross-sectional views showing production steps of the active matrix substrate.
Figure 10:
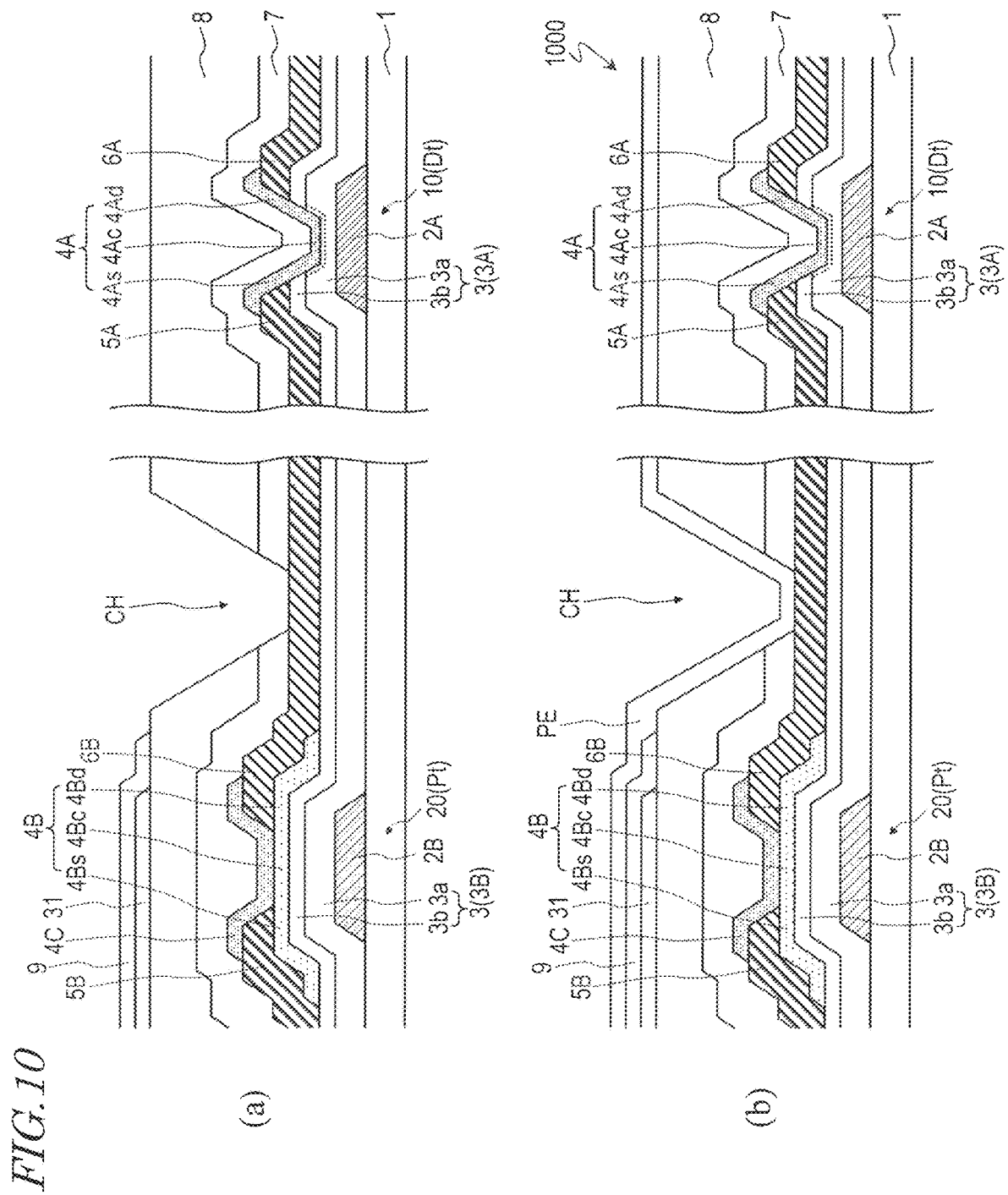
FIG. 10 (a) and (b) are step-by-step cross-sectional views showing production steps of the active matrix substrate.

Next, as shown in FIG. 6(*a*), source electrodes 5A and 5B and drain electrodes 6A and 6B are formed on the gate insulating layer 3 and the oxide semiconductor layer 4. The source electrode 5B and drain electrode 6B are formed so as to be in contact with an upper face of the oxide semiconductor layer 4B. For example, after depositing an electrically conductive film by sputtering, the electrically conductive film may be patterned through a photolithography process, thereby forming the source electrodes 5A and 5B and the drain electrodes 6A and 6B. As an electrically conductive film (source metal film) from which to form the source electrode 5 and the drain electrode 6, a film containing a metal such as aluminum (Al), tungsten (W), molybdenum (Mo), tantalum (Ta), copper (Cu), chromium (Cr), titanium (Ti), or gold (Au), or an alloy thereof, or a nitride thereof may be used as appropriate. Moreover, a multilayer film in which a plurality of such films are stacked may also be used. Herein, as the source metal film, a film in which a Ti film and a Cu film are stacked in this order is used, and the Cu film in the upper layer is patterned by wet etching, and thereafter the Ti film in the lower layer is patterned by dry etching. The source electrodes 5A and 5B and the drain electrodes 6A and 6B may have a thickness which is e.g. not less than 100 nm and not more than 500 nm.

Then, as shown in FIG. 6(b), a region (first region) of the gate insulating layer 3A that is exposed between the source electrode 5A and the drain electrode 6A is made thinner than a region (second region) of the gate insulating layer 3A that overlaps the source electrode 5A and drain electrode 6A. Herein, the time of dry etching when patterning the titanium film (i.e., the lower of the source metal film layer) is prolonged to remove a portion of the gate insulating layer 3A and thereby thinning the first region. Also herein, in the step of thinning the gate insulating layer 3, the portion located in the first region of the silicon oxide layer 3b is removed, and also the portion located in the first region of the silicon nitride layer 3a is removed partly along its thickness.

Next, as shown in FIG. 7(a), the surface of the portion located in the first region of the silicon nitride layer 3a (i.e., the portion which has been exposed by removing the silicon oxide layer 3b) is oxidized. This oxidation step may be performed by an oxygen plasma treatment, for example. The etching of the source metal film, etching of the gate insulating layer 3A, and the oxygen plasma treatment can be performed within the same vacuum machine. Through the oxidation step, a portion 3a' near the surface of the silicon nitride layer 3a becomes a silicon oxynitride layer or a silicon nitroxide layer.

Then, as shown in FIG. 7(b), an oxide semiconductor layer 4A is formed. For example, after depositing an oxide semiconductor film by sputtering, the oxide semiconductor film may be patterned through a photolithography process, thereby forming an island-shaped oxide semiconductor layer 4A. The oxide semiconductor layer 4A is formed so that the source electrode 5A and the drain electrode 5B are in contact with a lower face of the oxide semiconductor layer 4A. The oxide semiconductor layer 4A may be made of the same material as, or a different material from, that of the oxide semiconductor layer 4B. Moreover, in this step, the oxide semiconductor layer 4A is formed, and also an oxide semiconductor layer 4C covering the channel region 4Bc of the oxide semiconductor layer 4B is formed. By doing so, when patterning the oxide semiconductor film from which to form the oxide semiconductor layer 4A, the oxide semiconductor layer 4B can be prevented from becoming removed.

Next, as shown in FIG. 8(a), an inorganic insulating layer (passivation layer) 7 covering the source electrodes 5A and 5B, the drain electrodes 6A and 6B, and the oxide semiconductor layers 4A and 4C are formed. The inorganic insulating layer 7 may be formed by CVD technique, for example. As the inorganic insulating layer 7, a silicon oxide ($SiO_2$) layer, a silicon nitride (SiNx) layer, a silicon oxynitride (SiOxNy;x>y) layer, a silicon nitroxide (SiNxOy;x>y) layer, or the like may be used as appropriate. The inorganic insulating layer 7 may have a multilayer structure. For example, an $SiO_2$ layer may be formed as a lower layer on the substrate 1 side, and an SiNx layer may be formed thereon as an upper layer. By employing a layer containing oxygen (e.g., an oxide layer such as $SiO_2$) as the lower layer being in contact with the oxide semiconductor layer 4A, even if excessive oxygen deficiencies occur in the oxide semiconductor layer 4A due to intrusion of external moisture or impurities, etc., it becomes possible to remedy the oxygen deficiencies with the oxygen that is contained in the oxide layer. The inorganic insulating layer 7 may have a thickness which is e.g. not less than 200 nm and not more than 700 nm.

Then, as shown in FIG. 8(b), an aperture 7a through which a portion of the drain electrode 6B is exposed is made in the inorganic insulating layer 7. For example, the aperture 7a may be made through a photolithography process.

Next, as shown in FIG. 9(a), an organic insulating layer (planarization layer) 8 is formed on the inorganic insulating layer 7. The organic insulating layer 8 may be formed by using an acrylic resin material which is photosensitive, for example. An aperture 8a is made in the region of the organic insulating layer 8 that overlaps the aperture 7a of the inorganic insulating layer 7. The aperture 7a of the inorganic insulating layer 7 and the aperture 8a of the organic insulating layer 8 constitute a contact hole CH. The organic insulating layer 8 may have a thickness which is e.g. not less than 1.5 µm and not more than 3.0 µm. Note that an etching for the inorganic insulating layer 7 may be performed by using the organic insulating layer 8 as a mask, thereby making the aperture 7a. In that case, the step of forming and the step of removing a photoresist layer can be omitted when forming the aperture 7a, whereby the producibility is improved.

Then, as shown in FIG. 9(b), a common electrode 31 is formed on the organic insulating layer 8. For example, after depositing a transparent electrically conductive film on the organic insulating layer 8, the transparent electrically conductive film may be patterned to form the common electrode 31. As the material of the transparent electrically conductive film, ITO may be used, for example. The common electrode 31 may have a thickness of e.g. not less than 40 nm and not more than 150 nm.

Next, as shown in FIG. 10(a), a dielectric layer 9 is formed so as to cover the common electrode 31. The dielectric layer 9 may be a silicon nitride (SiNx) layer, for example. The dielectric layer 9 may have a thickness of e.g. not less than 100 nm and not more than 400 nm.

Thereafter, as shown in FIG. 10(b), a pixel electrode PE is formed on the dielectric layer 9. For example, after depositing a transparent electrically conductive film on the dielectric layer 9, the transparent electrically conductive film may be patterned to form the pixel electrode PE. As the material of the transparent electrically conductive film, ITO may be used, for example. The pixel electrode PE may have a thickness of e.g. not less than 40 nm and not more than 150 nm. In this manner, the active matrix substrate 1000 can be obtained.

In the step of thinning the gate insulating layer 3A, preferably, the first region of the gate insulating layer 3A is made so thin that the gate capacitance of the first TFT 10 is equal to or greater than twice that of the case where this step is not performed. Moreover, the thickness of the first region of the gate insulating layer 3A may be set so that the gate capacitance of the first TFT 10 is equal to or greater than twice the gate capacitance of the second TFT 20.

The oxide semiconductor layer 4A of the first TFT 10 and the oxide semiconductor layer 4B of the second TFT 20 may be made of the same material, or different materials. In the present embodiment, driving ability of the first TFT 10 is improved because the first region of the gate insulating layer 3A of the first TFT 10 is selectively thinned; further adjustments to the transistor characteristics of the first TFT 10 and/or the second TFT 20 may be made by forming the oxide semiconductor layer 4A of the first TFT 10 and the oxide semiconductor layer 4B of the second TFT 20 from different materials (which would also be inclusive of the use of the same components but different composition ratios, crystal structures, etc.)

For example, the oxide semiconductor layer 4A of the first TFT 10 may be made of a material of a higher mobility than that of the material of the oxide semiconductor layer 4B of the second TFT 20. Generally speaking, using a semiconductor material of high mobility will lower the threshold voltage, and tend to result in depletion characteristics. However, it is not a problem for DMX-circuit TFTs to have depletion characteristics, and their ON current should preferably be large; therefore, use of a high mobility material is suitable for them. On the other hand, it is not preferable for driving-circuit TFTs to have depletion characteristics; therefore, it is suitable to use a semiconductor material for them that provides a threshold voltage which is stably positive even if the mobility were to be at a standard level.

There is a general tendency that a TFT will have a lower threshold voltage as its channel length L (source-drain distance) becomes shorter. Therefore, the channel length L of the DMX-circuit TFT (first TFT 10) is preferably shorter than the channel length L of the driving-circuit TFT (second TFT 20). For example, the channel length L of the DMX-circuit TFT may be not less than 2 μm and not more than 5 μm, and the channel length L of the driving-circuit TFT may be not less than 4 μm and not more than 10 μm.

<Oxide Semiconductor>

The oxide semiconductor contained in the oxide semiconductor layers 4A and 4B may be an amorphous oxide semiconductor, or a crystalline oxide semiconductor having a crystalline portion. Examples of crystalline oxide semiconductors include polycrystalline oxide semiconductors, microcrystalline oxide semiconductors, crystalline oxide semiconductors whose c axis is oriented essentially perpendicular to the layer plane, and so on.

The oxide semiconductor layers 4A and 4B may have a multilayer structure of two or more layers. When the oxide semiconductor layers 4A and 4B has a multilayer structure, the oxide semiconductor layers 4A and 4B may include an amorphous oxide semiconductor layer and a crystalline oxide semiconductor layer. Alternatively, it may include a plurality of crystalline oxide semiconductor layers of different crystal structures. Moreover, it may include a plurality of amorphous oxide semiconductor layers.

In the exemplary construction illustrated FIG. 4, it is preferable for the oxide semiconductor layer 4B of the second TFT 20 to have a multilayer structure. The channel region 4B of the oxide semiconductor layer 4B becomes slightly etched during the dry etching when forming the source electrode 5B and drain electrode 6B and during the etching of the gate insulating film 3A, allowing a trap level to occur due to etching damage. This trap level may be a cause for variations in transistor characteristics or deteriorations in reliability. Therefore, it is preferable for the oxide semiconductor layer to have a multilayer structure. A layer of a relatively high carrier density may be disposed at the gate insulating layer 3B side, and a layer of a relatively low carrier density may be disposed at the inorganic insulating layer 7 side. By doing so, the trap level will occur in the layer of low carrier density, such that this layer will serve as if a barrier, whereby deteriorations in the transistor characteristics and reliability can be suppressed.

The material, structure, and method of film formation of an amorphous oxide semiconductor and each above crystalline oxide semiconductor, the construction of an oxide semiconductor layer having multilayer structure, etc., are described in Japanese Laid-Open Patent Publication No. 2014-007399, for example. The entire disclosure of Japanese Laid-Open Patent Publication No. 2014-007399 is incorporated herein by reference.

The oxide semiconductor layers 4A and 4B may contain at least one metallic element among In, Ga, and Zn, for example. In the present embodiment, the oxide semiconductor layer contains an In—Ga—Zn—O based semiconductor (e.g. indium gallium zinc oxide), for example. Herein, the In—Ga—Zn—O based semiconductor is a ternary oxide of In (indium), Ga (gallium), Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example. Such an oxide semiconductor layer may be made from an oxide semiconductor film containing an In—Ga—Zn—O based semiconductor.

The In—Ga—Zn—O based semiconductor may be amorphous or crystalline. As the crystalline In—Ga—Zn—O based semiconductor, a crystalline In—Ga—Zn—O based semiconductor whose c axis is oriented essentially perpendicular to the layer plane is preferable.

Note that the crystal structure of a crystalline In—Ga—Zn—O based semiconductor is disclosed in, for example, Japanese Laid-Open Patent Publication No. 2014-007399, supra, Japanese Laid-Open Patent Publication No. 2012-134475, Japanese Laid-Open Patent Publication No. 2014-209727, and so on. The entire disclosures of Japanese Laid-Open Patent Publication No. 2012-134475 and Japanese Laid-Open Patent Publication No. 2014-209727 are incorporated herein by reference. A TFT including an In—Ga—Zn—O based semiconductor layer has a high mobility (20 times that of an a-Si TFT or greater) and a low leakage current (less than 1/100 times that of an a-Si TFT), and therefore is suitably used as a driving TFT (e.g., a TFT that is included in a driving circuit which is provided on the same substrate as the display region, near a display region including a plurality of pixels) or as a pixel TFT (a TFT that is provided in a pixel).

Instead of an In—Ga—Zn—O based semiconductor, the oxide semiconductor layers 4A and 4B may contain any other oxide semiconductor. For example, it may contain an In—Sn—Zn—O based semiconductor (e.g. $In_2O_3$—$SnO_2$—ZnO; InSnZnO). An In—Sn—Zn—O based semiconductor is a ternary oxide of In (indium), Sn (tin), and Zn (zinc). Alternatively, the oxide semiconductor layers 4A and 4B may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, a Ga—Zn—O based semiconductor, or the like.

INDUSTRIAL APPLICABILITY

Embodiments of the present invention are suitably applicable to an active matrix substrate that includes oxide semiconductor TFTs. Such active matrix substrates are applicable to: display devices such as liquid crystal display devices, organic electroluminescence (EL) display devices, and inorganic electroluminescence display devices; imaging devices such as image sensor devices; image input devices;

fingerprint reader devices; and various electronic devices such as semiconductor memories.

REFERENCE SIGNS LIST 1 substrate
2A, 2B gate electrode
3, 3A, 3B gate insulating layer
3a silicon nitride layer
3b silicon oxide layer
4A, 4B, 4C oxide semiconductor layer
4Ac, 4Bc channel region
4As, 4Bs source contact region
4Ad, 4Bd drain contact region
5A, 5B source electrode
6A, 6B drain electrode
7 inorganic insulating layer (passivation layer)
7a aperture in inorganic insulating layer
8 organic insulating layer (planarization layer)
8a aperture in organic insulating layer
9 dielectric layer
10 first TFT
20 second TFT
31 common electrode
100 unit circuit
150 control circuit
1000 active matrix substrate
DR displaying region
FR non-displaying region (frame region)
P pixel region (pixel)
GD gate drivers
SD source driver
DMX demultiplexer circuit
GL gate bus line
SL source bus line
Pt pixel TFT
PE pixel electrode
DO video signal line
B branch line
SW control signal line
Dt DMX-circuit TFT

The invention claimed is:

1. An active matrix substrate having a displaying region including a plurality of pixels and a non-displaying region located around the displaying region, the active matrix substrate comprising:
   a substrate;
   a plurality of first TFTs supported by the substrate and provided in the non-displaying region;
   a peripheral circuit including the plurality of first TFTs; and
   a plurality of second TFTs supported by the substrate and provided in the displaying region and/or the non-displaying region; wherein
   each of the plurality of first TFTs includes:
     a first gate electrode provided on the substrate;
     a first gate insulating layer covering the first gate electrode;
     a first oxide semiconductor layer opposed to the first gate electrode via the first gate insulating layer, the first oxide semiconductor layer including a channel region and a source contact region and a drain contact region located on opposite sides of the channel region;
     a first source electrode connected to the source contact region of the first oxide semiconductor layer; and
     a first drain electrode connected to the drain contact region of the first oxide semiconductor layer;
   each of the plurality of first TFTs includes a bottom contact structure such that the first source electrode and the first drain electrode are in contact with a lower face of the first oxide semiconductor layer;
   a first region of the first gate insulating layer that overlaps the channel region has a thickness which is smaller than a thickness of a second region of the first gate insulating layer that overlaps the source contact region and the drain contact region;
   each of the plurality of second TFTs includes:
     a second gate electrode provided on the substrate;
     a second gate insulating layer covering the second gate electrode;
     a second oxide semiconductor layer opposed to the second gate electrode via the second gate insulating layer, the second oxide semiconductor layer including a channel region and a source contact region and a drain contact region located on opposite sides of the channel region of the second oxide semiconductor layer;
     a second source electrode connected to the source contact region of the second oxide semiconductor layer; and
     a second drain electrode connected to the drain contact region of the second oxide semiconductor layer;
   each of the plurality of second TFTs has a top contact structure such that the second source electrode and the second drain electrode are in contact with an upper face of the second oxide semiconductor layer; and
   a third oxide semiconductor layer which covers the channel region of the second oxide semiconductor layer is provided the third oxide semiconductor layer is in a same layer as the first oxide semiconductor layer.

2. The active matrix substrate of claim 1, wherein the peripheral circuit is a demultiplexer circuit.

3. The active matrix substrate of claim 1, wherein a thickness of the first region of the first gate insulating layer is set so that a gate capacitance of each of the plurality of first TFTs is equal to or greater than twice a gate capacitance of each of the plurality of second TFTs.

4. The active matrix substrate of claim 1, wherein the plurality of second TFTs include a pixel TFT disposed for each of the plurality of pixels.

5. The active matrix substrate of claim 1, further comprising a driving circuit provided in the non-displaying region, wherein
   the plurality of second TFTs include a TFT composing the driving circuit.

6. The active matrix substrate of claim 1, wherein the second oxide semiconductor layer has a multilayer structure.

7. The active matrix substrate of claim 1, wherein the first oxide semiconductor layer comprises an In—Ga—Zn—O based semiconductor.

8. The active matrix substrate of claim 7, wherein the In—Ga—Zn—O based semiconductor includes a crystalline portion.

9. A method of producing an active matrix substrate having a displaying region including a plurality of pixels and a non-displaying region located around the displaying region, the active matrix substrate comprising:
   a substrate;
   a plurality of first TFTs supported by the substrate and provided in the non-displaying region; and
   a peripheral circuit including the plurality of first TFTs, each of the plurality of first TFTs including:

a first gate electrode provided on the substrate;
a first gate insulating layer covering the first gate electrode;
a first oxide semiconductor layer opposed to the first gate electrode via the first gate insulating layer, the first oxide semiconductor layer including a channel region and a source contact region and a drain contact region located on opposite sides of the channel region;
a first source electrode connected to the source contact region of the first oxide semiconductor layer; and
a first drain electrode connected to the drain contact region of the first oxide semiconductor layer,
the method comprising:
(A) a step of forming the first gate electrode on the substrate;
(B) a step of forming the first gate insulating layer covering the first gate electrode;
(C) a step of forming the first source electrode and the first drain electrode on the first gate insulating layer;
(D) a step of forming the first oxide semiconductor layer after step (C), wherein the first oxide semiconductor layer is formed so that the first source electrode and the first drain electrode are in contact with a lower face of the first oxide semiconductor layer; and
(E) a step, between step (C) and step (D), of causing a first region of the first gate insulating layer that is exposed between the first source electrode and the first drain electrode to become thinner than a second region of the first gate insulating layer that overlaps the first source electrode and the first drain electrode; wherein
the active matrix substrate further includes a plurality of second TFTs supported by the substrate and provided in the displaying region and/or the non-displaying region,
each of the plurality of second TFTs including:
  a second gate electrode provided on the substrate;
  a second gate insulating layer covering the second gate electrode;
  a second oxide semiconductor layer opposed to the second gate electrode via the second gate insulating layer, the second oxide semiconductor layer including a channel region and a source contact region and a drain contact region located on opposite sides of the channel region of the second oxide semiconductor layer;
  a second source electrode connected to the sourc contact region of the second oxide semiconductor layer; and
  a second drain electrode connected to the drain contact region of the second oxide semiconductor layer,
the method further comprising a step (G), between step (B) and step (C), of forming the second oxide semiconductor layer on the second gate insulating layer; and
in step (C), when the first source electrode and the first drain electrode are formed, the second source electrode and the second drain electrode are formed so as to be in contact with an upper face of the second oxide semiconductor layer.

10. The method of producing an active matrix substrate of claim 9, wherein the peripheral circuit is a demultiplexer circuit.

11. The method of producing an active matrix substrate of claim 9, wherein, in step (E), the first region of the first gate insulating layer is made thin so that a gate capacitance of each of the plurality of first TFTs is equal to or greater than twice that of a case where step (E) is not performed.

12. The method of producing an active matrix substrate of claim 9, wherein,
step (B) comprises:
  (B1) a step of forming a silicon nitride layer covering the first gate electrode; and
  (B2) a step of forming a silicon oxide layer on the silicon nitride layer; and,
in step (E), at least a portion of the silicon oxide layer that is located in the first region is removed.

13. The method of producing an active matrix substrate of claim 12, further comprising a step (F), between step (E) and step (D), of oxidizing a surface of a portion of the silicon nitride layer that is located in the first region.

14. The active matrix substrate of claim 9, wherein, in step (D), when the first oxide semiconductor layer is formed, a third oxide semiconductor layer covering the channel region of the second oxide semiconductor layer is formed.

15. The method of producing an active matrix substrate of claim 9, wherein the plurality of second TFTs include a pixel TFT disposed for each of the plurality of pixels.

16. The method of producing an active matrix substrate of claim 9, wherein,
the active matrix substrate further comprises a driving circuit provided in the non-displaying region; and
the plurality of second TFTs include a TFT composing the driving circuit.

17. The method of producing an active matrix substrate of claim 9, wherein the second oxide semiconductor layer has a multilayer structure.

* * * * *